United States Patent [19]

Kawada et al.

[11] Patent Number: 5,663,865

[45] Date of Patent: Sep. 2, 1997

[54] CERAMIC ELECTROSTATIC CHUCK WITH BUILT-IN HEATER

[75] Inventors: Nobuo Kawada; Ryoji Nakajima; Toshihiko Shindo; Takaaki Nagao. all of Annaka, Japan

[73] Assignee: Shin-Etsu Chemical Co., Ltd., Tokyo, Japan

[21] Appl. No.: 603,155

[22] Filed: Feb. 20, 1996

[30] Foreign Application Priority Data

Feb. 20, 1995 [JP] Japan ................... 7-030483

[51] Int. Cl.⁶ ................................. H02N 13/00
[52] U.S. Cl. ................................. 361/234
[58] Field of Search ................... 361/233, 234; 269/8, 903; 279/128

[56] References Cited

U.S. PATENT DOCUMENTS 5,566,043  10/1996  Kawada et al. ................... 361/234

Primary Examiner—Fritz Fleming
Attorney, Agent, or Firm—David E. Dougherty

[57] ABSTRACT

Proposed is a ceramic-based electrostatic chuck with built-in heater used in high-temperature processing of a semiconductor silicon wafer, which is capable of exhibiting excellent electrostatic attracting force even at a temperature at which conventional ceramic-based electrostatic chucks cannot exhibit high attracting force. The electrostatic chuck with built-in heater of the invention is an integral body comprising: (a) a base body of a sintered mixture of boron nitride and aluminum nitride; (b) a first pyrolytic graphite layer formed on one surface of the base body to serve as a resistance heater element; (c) a first insulating layer of pyrolytic boron nitride on the first pyrolytic graphite layer; (d) a second pyrolytic graphite layer formed on the other surface of the base body to serve as the electrodes for electrostatic chucking; and (e) a second insulating layer on the second pyrolytic graphite layer formed from a pyrolytic composite nitride of boron and silicon of which the content of silicon is in the range from 1% to 10% by weight having an appropriate volume resistivity at a temperature of 500° to 650° C. as deposited by the pyrolysis of a gaseous mixture of ammonia, boron trichloride and silicon tetrachloride.

6 Claims, 2 Drawing Sheets

CERAMIC ELECTROSTATIC CHUCK WITH BUILT-IN HEATER

BACKGROUND OF THE INVENTION

The present invention relates to a ceramic electrostatic chuck with built-in heater or, more particularly, to a ceramic-made device used for heating a flat substrate material such as a semiconductor silicon wafer as a workpiece under chucking with an electrostatic attracting force in the manufacturing process of, for example, semiconductor devices which involves a step of working on the substrate at an elevated temperature.

It is sometimes the case in the manufacturing process of semiconductor devices that working on a substrate such as a semiconductor silicon wafer is performed under heating of the substrate at a high temperature by mounting the wafer on a heater. Conventional heaters used for this purpose utilize electric resistance heating with a coiled resistance wire as the resistance heater element. Such an electric heater, however, is disadvantageous in respect of the possibility of contamination of the semiconductor silicon wafer with the metallic elements as the constituents of the resistance wires. In this regard, proposals have been made for a so-called ceramic heater which is an integral device consisting of an electrically insulating ceramic base body and a thin film of an electroconductive ceramic material such as graphite formed on one surface of the ceramic base body to serve as a heater element (see, for example, Japanese Patent Kokai No. 4-124076).

It is also required in the above mentioned process of a semiconductor silicon wafer with a ceramic heater that the silicon wafer is fixed and immobilized on the heater in order to ensure accuracy of working on the silicon wafer by the use of a chucking means. Since the working process of a silicon wafer in many cases is conducted under a reduced pressure or in vacuum, traditional vacuum chucks can no longer work there so that electrostatic chucks are currently under use in an atmosphere under reduced pressure. Along with the trend in the semiconductor processes that the working temperature on a silicon substrate is increased higher and higher, ceramics are used as the material of the electrostatic chucks (see, for example, Japanese Patent Kokai No. 52-67353 and No. 59-124140). It is also a trend in recent years to use a ceramic electrostatic chuck with built-in heater, which is an integral device as a combination of a ceramic electrostatic chuck and a ceramic heater. Such a ceramic electrostatic chuck with built-in heater has a structure in which a base body of a ceramic material is provided, on one surface, with a first electroconductive layer for electric resistance heating and, on the other surface, with a second electroconductive layer to serve as the electrodes for generating an electrostatic attracting force, each of the electroconductive layers being overlaid with an insulating layer for protection. When the working temperature of such a ceramic electrostatic chuck with built-in heater is relatively low as in the etching process, the material of the insulating layer thereof can be alumina and the like (see, for example, Japanese Patent Kokai No. 59-124140) while, when the working temperature is very high as in the CVD process, a highly refractory material such as pyrolytic boron nitride and the like is used for the insulating layer thereof (see, for example, Japanese Patent Kokai No. 4-358074, No. 5-109676 and No. 5-129210).

Although, as is described in several literatures, the electrostatic attracting force of a ceramic electrostatic chuck is increased as the volume resistivity of the insulating layer is decreased, the insulating layer in an electrostatic chucking device must have a volume resistivity in the range from $10^{16}$ to $10^{13}$ ohm·cm or, preferably, around $10^{11}$ ohm·cm because, when the volume resistivity of the insulating layer is too low, eventual break of the device is sometimes caused due to a leak current.

When alumina is used as the material of the insulating layer of a ceramic electrostatic chuck working in an intermediately high temperature range of 500° C. to 650° C., for example, the resistivity of the insulating layer is so low that break of the device is sometimes unavoidable due to the leak current while, when pyrolytic boron nitride is used for the insulating layer, the resistivity of the insulating layer is too high to give a sufficiently high electrostatic attractive force of, for example, 100 to 500 gf/cm².

SUMMARY OF THE INVENTION

The present invention accordingly has an object to provide, by solving the above described problems in the prior art, a novel ceramic-based electrostatic chuck with built-in heater capable of satisfactorily working at an intermediately high temperature in the range from 500° to 650° C.

Thus, the ceramic-based electrostatic chuck with built-in heater of the invention is an integral body which comprises:

(a) a base body of a sintered blend of boron nitride and aluminum nitride having flat surfaces;

(b) a first electroconductive layer of pyrolytic graphite formed on one of the flat surfaces of the base body to serve as an electric resistance heater element;

(c) a first insulating layer of pyrolytic boron nitride formed on the first electroconductive layer to serve as an insulating layer;

(d) a second electroconductive layer of pyrolytic graphite on the surface of the base body opposite to the surface on which the first electroconductive layer is formed; and (e) a second insulating layer of a pyrolytic composite nitride of boron and silicon, of which the content of silicon is in the range from 1 to 10% by weight or, preferably, from 5 to 9% by weight formed on the second electroconductive layer to serve as an insulating layer.

DETAILED DESCRIPTION OF THE PREFERRED EMBODIMENTS

As is described above, the present invention provides a ceramic electrostatic chuck with built-in heater, which is an integral body comprising a substrate plate made from a sintered body of a mixture of boron nitride and aluminum nitride provided on one flat surface with a first electroconductive layer of pyrolytic graphite to serve as a heat-generating layer and a first insulating layer of pyrolytic boron nitride formed on the first electroconductive layer and also provided on the other flat surface with a second electroconductive layer of pyrolytic graphite to serve as the electrodes for electrostatic chucking and a second insulating layer made from pyrolytic composite nitride of boron and silicon containing 1 to 10% by weight of silicon as formed on the second electroconductive layer.

To explain it in more detail, the inventors have conducted extensive investigations, in connection with a ceramic electrostatic chuck with built-in heater having insulating layers of pyrolytic boron nitride, to develop a means for preventing the decrease in the electrostatic attracting force within an intermediate temperature range and, as a result, have arrived at an unexpected discovery that this problem can be solved by providing a substrate or a sintered ceramic base body of a mixture of boron nitride and aluminum nitride, on one of the flat surfaces, with a first electroconductive layer of pyrolytic graphite to serve as a resistance heat-generating layer and a first insulating layer of pyrolytic boron nitride and, on the other of the flat surfaces, with a second electroconductive layer of pyrolytic graphite to serve as the electrodes to generate the electrostatic attracting force and a second insulating layer of a composite pyrolytic nitride of boron and silicon in which the content of silicon is in a specified range by weight.

Figure 1:
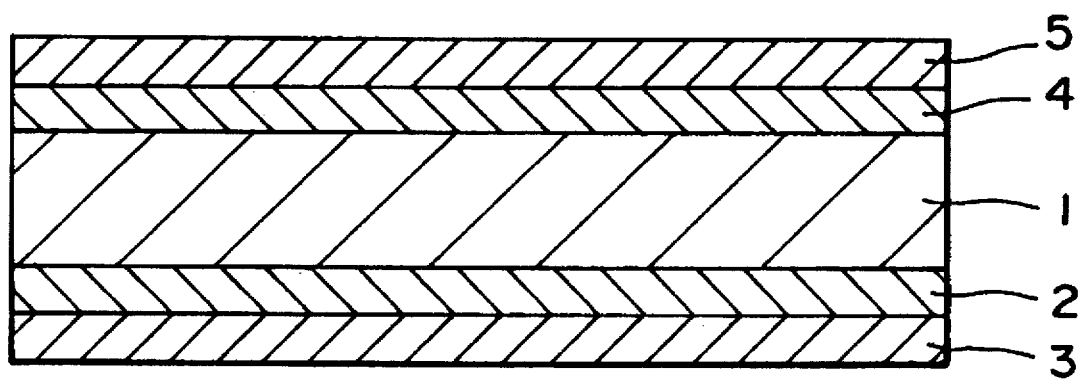
FIG. 1 is a schematic vertical cross sectional view of the inventive ceramic electrostatic chuck with built-in heater.

FIG. 1 of the accompanying drawing schematically illustrates a typical example of the inventive electrostatic chuck with built-in heater by a vertical cross sectional view. In this figure, the base body 1 made from a sintered body of a mixture of boron nitride and aluminum nitride is provided on one of the flat surfaces with a first electroconductive layer 2 of pyrolytic graphite to serve as a heat-generating layer by electric resistance and, further thereon, with a first insulating layer 3 of pyrolytic boron nitride and, on the other of the flat surfaces opposite to the first electroconductive layer 2, with a second electroconductive layer 4 of pyrolytic graphite to serve as the electrodes for the generation of an electrostatic attracting force and, further thereon, with a second insulating layer 5 which is made from pyrolytic composite nitride of boron and silicon containing 1 to 10% by weight of silicon.

In the conventional ceramic electrostatic chucks with built-in heater, both of the insulating layers, one, on the first electroconductive layer of pyrolytic graphite to serve as an electric resistance layer for heat generation formed on a sintered base body of a mixture of boron nitride and aluminum nitride and, the other, on the second electroconductive layer of pyrolytic graphite to serve as electrodes for electrostatic chucking on the other surface of the base body are formed each from pyrolytic boron nitride alone.

A problem in the above mentioned conventional structure of electrostatic chucks with built-in heater is that, as a consequence of the high volume resistivity of the pyrolytic boron nitride forming the insulating layers at a temperature in the range from 500° to 650° C., a sufficiently high electrostatic attracting force can hardly be obtained in this temperature range so that the workpiece such as a silicon wafer cannot be attracted to and held on the chucking surface with a high contacting force so that the temperature distribution in the workpiece is consequently sometimes not uniform enough resulting in low reproducibility in the performance of the semiconductor devices prepared thereby.

In contrast thereto, the most characteristic feature of the inventive electrostatic chuck with built-in heater consists in that one of the insulating layers on the second electroconductive layer of pyrolytic graphite to serve as the electrostatic electrodes is formed from a pyrolytic composite nitride of boron and silicon containing from 1 to 10% by weight of silicon. By the use of this very unique material for the insulating layer, a fully high electrostatic attracting force can be obtained even at a temperature in the range from 500° to 650° C. to give a very uniform temperature distribution in the workpiece thereon without any risk of damage on the workpiece due to a leak current through the insulating layer so that the yield of acceptable products can be greatly increased.

When the content of silicon is less than 1% by weight in the second insulating layer, the above mentioned improvements in the performance of the electrostatic chuck can hardly be obtained as a matter of course while, when the content of silicon is too large, an undue decrease is caused in the electric resistivity of the insulating layer within the above mentioned temperature range resulting in an eventual damage on the workpiece held by the electrostatic chuck due to a leak current.

Figure 2:
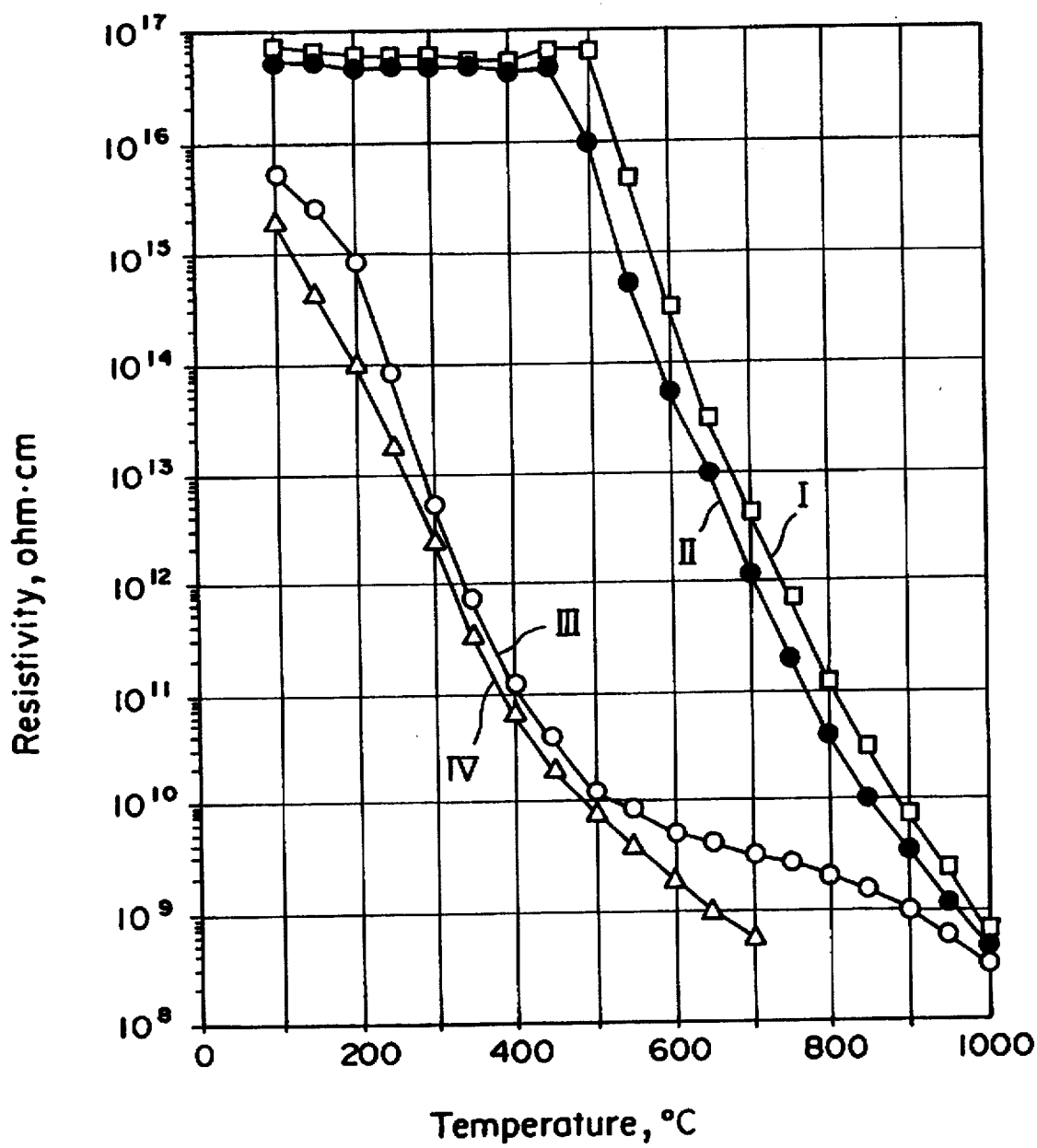
FIG. 2 is a graph showing the volume resistivity of pyrolytic boron nitride (curve I), pyrolytic composite nitride of boron and silicon containing 1% by weight of silicon (curve II), pyrolytic composite nitride of boron and silicon containing 10% by weight of silicon (curve III) and alumina (curve IV) as a function of temperature up to 1000° C.

FIG. 2 of the accompanying drawing is a graph showing the volume resistivity of various materials as a function of temperature in the range from 100° to 1000° C., of which the curve I is for pyrolytic boron nitride, curve II is for a pyrolytic composite nitride of boron and silicon containing 1% by weight of silicon, curve III is for a pyrolytic composite nitride of boron and silicon containing 10% by weight of silicon and curve IV is for aluminum oxide. It is understood from this graph that a volume resistivity of $10^{10}$ to $10^{13}$ ohm·cm can be obtained in the temperature range from 500° to 650° C. when the content of silicon is from 1 to 10% by weight in a pyrolytic composite nitride of boron and silicon.

The base body of the inventive electrostatic chuck with built-in heater can be rather conventional and the material thereof is a sintered body of a mixture of boron nitride and aluminum nitride as disclosed in Japanese Patent Kokai 7-10665 though not particularly limitative thereto. The mixing ratio of boron nitride and aluminum nitride is usually in the range from 1:0.05 to 1:1 by weight. When the proportion of aluminum nitride is too large, the thermal expansion coefficient of the sintered body is too high as compared with pyrolytic graphite while, when the proportion of aluminum nitride is too small, the thermal expansion coefficient of the sintered body is too low as compared with pyrolytic graphite.

The electroconductive layers of pyrolytic graphite to serve as the resistance heater element and electrostatic electrodes for chucking can be formed by the deposition of graphite produced by pyrolysis of, for example, methane at a temperature of 1900° to 2200° C. under a pressure of around 5 Torr on the respective flat surfaces of the base body. The thickness of the electroconductive layers of pyrolytic graphite is, preferably, in the range from 10 to 300 μm. When the thickness is too small, the layers have only insufficient mechanical strengths while, when the thickness is too large, the layer eventually causes falling from the substrate surface by exfoliation.

The first insulating layer on the first electroconductive layer of pyrolytic graphite for the resistance heater element is formed from pyrolytic boron nitride according to a known procedure in which, for example, a gaseous mixture of ammonia and boron trichloride in a mixing ratio of 4:1 is subjected to pyrolysis at a temperature of 1800° to 2000° C. under a pressure of 10 Torr to deposit boron nitride on the pyrolytic graphite layer. The thickness of the first insulating layer is, preferably, in the range from 50 to 500 μm the same reasons as in the electroconductive layers of pyrolytic graphite.

The second insulating layer on the second electroconductive layer of pyrolytic graphite for the electrostatic electrodes is necessarily formed from a pyrolytic composite nitride of boron and silicon in which the content of silicon is in the range from 1 to 10% by weight. Such a composite nitride layer can be formed by the pyrolysis of a gaseous mixture of ammonia, boron trichloride and silicon tetrachloride in a volume ratio of 40:9:1 to 24:5:1 at a temperature in the range from 1600° to 2000° C. under a pressure of 5 to 10 Torr to deposit the pyrolytic nitride on the surface of the pyrolytic graphite layer. The thickness of this second insulating layer is, preferably, in the range from 50 to 500 μm. When the thickness thereof is too small, troubles are sometimes caused due to dielectric breakdown in the insulating layer while, when the thickness is too large, an undue decrease is caused in the electrostatic attracting force for holding the workpiece mounted on the insulating layer due to the increase in the distance from the electrostatic electrodes to the workpiece.

It is of course optional that the first insulating layer on the first electroconductive layer of pyrolytic graphite is formed not from substantially pure pyrolytic boron nitride as is described above but from the same composite pyrolytic nitride of boron and silicon as the second insulating layer so that an advantage is obtained by the simplification and by the improvement in the productivity of the manufacturing process of the inventive electrostatic chucks because both of the two insulating layers can be formed at one time by using the same pyrolysis system.

In the following, the present invention is described in more detail by way of an example.

EXAMPLE

A disc-formed base body for an electrostatic chuck with built-in heater having a diameter of 200 mm and a thickness of 10 mm was prepared by sintering a powder blend of boron nitride and aluminum nitride in a weight proportion of 3:1 at a temperature of 1900° C. under a compressive force of 200 kgf/mm$^2$.

The above prepared base body was brought into a pyrolysis chamber into which methane was introduced and pyrolyzed therein at a temperature of 2200° C. under a pressure of 5 Torr to deposit pyrolytic graphite on both of the flat surfaces of the base body in a thickness of 100 μm. The pyrolytic graphite layer on one of the flat surfaces of the base body was mechanically worked by shaving into the pattern of an electric resistance heater dement to serve as the built-in heater and the pyrolytic graphite layer on the other flat surface was mechanically worked by shaving into the pattern of electrodes for electrostatic chucking.

Further, the base body provided with the pyrolytic graphite layers was brought into a pyrolysis chamber into which a gaseous mixture of ammonia, boron trichloride and silicon tetrachloride in a mixing ratio of 32:7:1 by volume was introduced and subjected to pyrolysis therein at a temperature of 1600° C. under a pressure of 5 Torr to deposit pyrolytic composite nitride of boron and silicon on the surface of the respective pyrolytic graphite layers in a thickness of 200 μm to serve as an insulating layer. The content of silicon in the insulating layers was found by analysis to be 7% by weight.

A semiconductor silicon wafer having a diameter of 200 mm and a thickness of 0.6 mm was mounted on the second insulating layer of the thus prepared electrostatic chuck with built-in heater and subjected to a process for the deposition of polysilicon layer thereon under heating at around 600° C.

The temperature distribution on the surface of the silicon wafer during the process was very narrow with a difference of 10° C. between the spots of the highest and lowest temperatures. The thickness of the polysilicon layer thus formed was also uniform to be within a range of 0.10 to 0.11 μm.

COMPARATIVE EXAMPLE

Another ceramic electrostatic chuck with built-in heater was prepared in just the same way as in the Example described above excepting omission of silicon tetrachloride in the gaseous mixture for the pyrolytic deposition of the insulating layers.

The evaluation test of this electrostatic chuck was undertaken also in the same manner as in the Example to find that the difference in the temperature of the silicon wafer mounted thereon was 26° C. between the spots of the highest and lowest temperatures and the thickness of the polysilicon layer was distributed in the range from 0.08 to 0.12 μm.

What is claimed is:

1. A ceramic-based electrostatic chuck with built-in heater which comprises, as an integral body:
    (a) a base body of a sintered blend of boron nitride and aluminum nitride having opposite surfaces;
    (b) a first electroconductive layer of pyrolytic graphite formed on one of the surfaces of the base body to serve as an electric resistance heater means;
    (c) a first insulating layer of pyrolytic boron nitride formed on the first electroconductive layer;
    (d) a second electroconductive layer of pyrolytic graphite formed on the surface of the base body opposite to the surface on which the first electroconductive layer is formed to serve as electrodes for electrostatic chucking means; and
    (e) a second insulating layer of a pyrolytic composite nitride of boron and silicon of which the content of silicon is in the range from 1 to 10% by weight formed on the second electroconductive layer.

2. The ceramic-based electrostatic chuck with built-in heater as claimed in claim 1 in which the second insulating layer has a thickness in the range from 50 μm to 500 μm.

3. The ceramic-based electrostatic chuck with built-in heater as claimed in claim 1 in which the the content of silicon in the pyrolytic composite nitride of boron and silicon is in the range from 5% to 9% by weight.

4. The ceramic-based electrostatic chuck with built-in heater as claimed in claim 1 in which the pyrolytic composite nitride of boron and silicon is a pyrolysis product of a gaseous mixture of ammonia, boron trichloride and silicon tetrachloride.

5. The ceramic-based electrostatic chuck with built-in heater as claimed in claim 4 in which the mixing ratio of ammonia, boron trichloride and silicon tetrachloride in the gaseous mixture is in the range from 40:9:1 to 24:5:1 by volume.

6. A ceramic-based electrostatic chuck with built-in heater which comprises, as an integral body:
    (a) a base body of a sintered blend of boron nitride and aluminum nitride having opposite surfaces;
    (b) a first electroconductive layer of pyrolytic graphite formed on one of the surfaces of the base body to serve as an electric resistance heater means;
    (c) a first insulating layer of pyrolytic boron nitride formed on the first electroconductive layer;
    (d) a second electroconductive layer of pyrolytic graphite formed on the surface of the base body opposite to the surface on which the first electroconductive layer is formed to serve as electrodes for electrostatic chucking means; and (e) a second insulating layer formed on the second electroconductive layer, the first and second insulating layers being formed from a pyrolytic composite nitride of boron and silicon of which the content of silicon is in the range from 1 to 10% by weight.

* * * * *